July 20, 1965 J. D. BAGLEY 3,196,358

VARIABLE PATTERN PULSE GENERATOR

Filed Nov. 10, 1961

INVENTOR
JOHN D. BAGLEY
BY Frank Chadurjian
ATTORNEY

United States Patent Office 3,196,358

Patented July 20, 1965

3,196,358

VARIABLE PATTERN PULSE GENERATOR

John D. Bagley, Ann Arbor, Mich., assignor to International Business Machines Corporation, New York, N.Y., a corporation of New York Filed Nov. 10, 1961, Ser. No. 151,540
6 Claims. (Cl. 328—55)

This invention relates to pattern generators and more particularly to a gated pulse generator for providing a desired pattern of N pulses for each cycle of $(N+M)$ possible pulses from the generator.

In a system having a given clock pulse generator, where a different pattern of pulses is required, it has been the practice to gate desired ones of the pulses from the generator by use of a gating circuit for each pulse of the generator desired, in some instances inserting a commercially available ring counter having desired ones of the outputs fom the different stages gated while in other instances providing a binary counter in combination with a decoding circuit. Each of these techniques is not only costly, in a pecuniary sense, but in terms of components which increases the probability of operating failure.

It has been found that by constructing a circuit according to this invention the above disadvantages are overcome. If a simple clock pulse generator is provided which emits a pulse each increment of time $(t_0)$ with each pulse having a predetermined pulse period duration $k(t_0)$, where $(0<k<1)$, means are provided for gating the pulses from the generator to provide a number of N pulses for each cycle of $(N+M)$ possible pulses from the generator. More specifically, the pulses from the generator are fed to a gating circuit. An output of the gating circuit is connected back to a conditioning input of the gating circuit through a delay feedback loop circuit. The feedback loop circuit comprises a bistable flip-flop switching device having a set input, a reset input, and an output taken off the reset side of the device. A first delay device is connected to the reset input of the flip-flop which acts to delay an input thereto a predetermined multiple of $k(t_0)$ pulse periods. A second delay device is connected to the reset output of the flip-flop which also acts to delay an input thereto a predetermined multiple of $k(t_0)$ pulse periods. Whether the multiple of pulse periods $k(t_0)$ provided by each of the ΔA and ΔB delay devices is an integral number and whether the integral number is even or odd is defined by and dependent upon the value of $k$. Both the set input of the flip-flop and the first delay device are connected to the output of the gating circuit while the second delay device is connected to the conditioning input of the gating circuit. For a desired output pulse pattern within a predetermined cycle $(N+M)$, the delay periods in a first embodiment for both the first and second delay devices are adjusted such that the total delay provided by both delay devices and the associated flip-flop circuit and AND gate is $(N+M-1+2k)t_0$; and in a second embodiment both delay devices with the associated circuitry are adjusted to provide a total delay of $$(N+M-1+k)t_0$$

Accordingly, it is a prime object of this invention to provide an improved pulse pattern generator.

Another object of this invention is to provide a simple, yet improved pulse pattern generator which is relatively cheap to construct.

Still another object of this invention is to provide a gating circuit in combination with a clock pulse generator to provide a desired pulse pattern by means of a pair of delay devices in a switching circuit connected in feedback loop relationship for gating the pulses from the generator.

The foregoing and other objects, features and advantages of the invention will be apparent from the following more particular description of preferred embodiments of the invention, as illustrated in the accompanying drawings:

Figure 1:
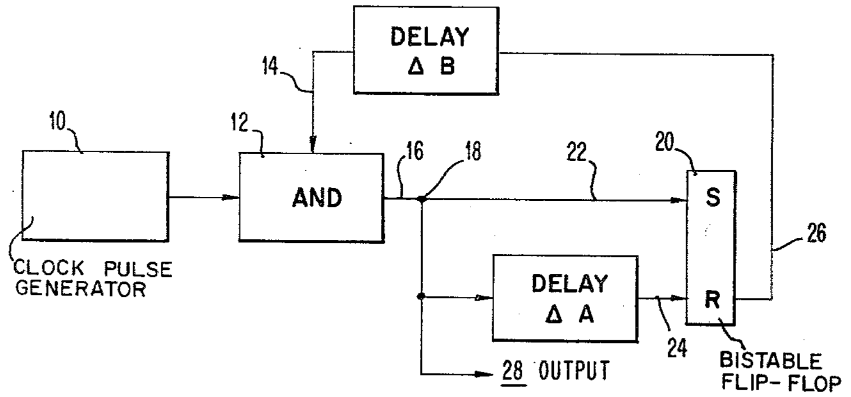
FIG. 1 is a circuit schematic according to this invention.
Figure 2:
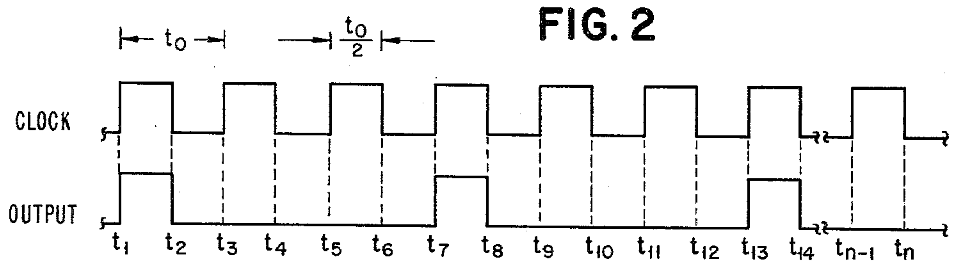
FIG. 2 is a representation of pulses applied to and pulses provided by the circuit of FIG. 1 according to one embodiment of this invention.

Referring to the FIGS. 1 and 2, a circuit is shown which is capable of providing a desired output pulse pattern by selectively gating pulses from a clock pulse generator 10. The generator 10 is adapted to provide a pulse for each increment of time $(t_0)$ with each pulse having a pulse duration or duty factor period of $k(t_0)$. The duty factor $k$ is defined by the clock pulse width divided by the clock period $(t_0)$. Therefore, the duty factor $k$ is $(0<k<1)$. In order to simplify the construction and understanding of the circuit of FIG. 1, a duty factor, $k$ of $(1/2)$ will hereafter be employed and thus the pulse duration period provided by generator 10 is $(t_0/2)$, as is shown in the FIG. 2 by a sequence of pulses labelled "clock" having time designations $t_1$ through $t_n$. The generator 10 is connected to an AND circuit 12. The AND circuit 12 is provided with a conditioning input line 14 and an output line 16 connected to a terminal 18. A bistable flip-flop switching device 20, such as a bistable Eccles-Jordan trigger, is provided having a set input line 22 and a reset input line 24. The flip-flop is provided with a reset output 26 and the flip-flop 20 operates to provide a high level output voltage on the output line 26 when triggered to a stable reset condition and a low level voltage on the output line 26 when triggered to the set condition. A first delay device, ΔA, is connected to the reset input 24 of flip-flop 20. A second delay device, ΔB, is connected to the reset output line 26 of flip-flop 20. The terminal 18 is connected to an output line 28, the ΔA delay device and the set input line 22 of flip-flop 20, while the ΔB delay device is connected to the conditioning input line 14 of AND circuit 12.

In operation, the flip-flop 20 is initially assumed to be in a reset condition. Since the flip-flop 20 is in a reset condition, the initial pulse from generator 10 which is applied to the AND circuit 12 is conditioned by the input line 14 and passed to the output line 16 and thence to the output 28. This initial pulse from generator 10 is also applied to the set input line 22 of flip-flop 20 to switch the flip-flop to the set condition. The flip-flop 20 in switching to the set stable state provides a low level voltage on the output line 26. This low level output voltage is thereafter applied to input line 14 delayed by a period determined by the ΔB delay device. This low voltage condition on line 14 cuts off any further output through the AND circuit 12. The first pulse from generator 10 is also applied, via output line 16 of AND circuit 12 to the ΔA delay device. The ΔA delay device, at some time later, applies a pulse to the reset input line 24 of the flip-flop 20 causing the flip-flop 20 to switch to the reset stable state. The flip-flop 20 in switching to the reset stable state provides a high level voltage output to the conditioning input line 14 delayed by a time period determined by the ΔB delay device to thereby allow any succeeding pulse from the generator 10 to pass through AND circuit 12 and output 28 thus starting the cycle over again.

Assume that it is desired to provide a particular number of N pulses at the output 28 of circuit of FIG. 1 for each cycle of (N+M) possible pulses from the source 10. In the general case, where the pulse period is $k(t_0)$ and $(0<k\leqq\frac{1}{2})$, the delay provided by ΔA and ΔB is obtained by a general relationship:

$$(N+N-1+2k)t_0\leqq(\Delta A+\Delta B)\leqq(N+M)t_0$$

where $$(N-1+k)t_0\leqq\Delta B\leqq(N-k)t_0$$

When $M>N$, and $(0<k<1)$, a general relationship:

$$(N+M-1+k)t_0\leqq\Delta A+\Delta B\leqq(N+M)t_0$$

exists, where $$(N-1+k)t_0\leqq\Delta B\leqq Nt_0$$

As stated above, in order to simplify construction and an understanding of this pattern generator, a half pulse period of $(t_0/2)$ will be employed. More specifically, assume it is desired to provide one pulse for every three pulses from the source 10 as is shown by a pulse pattern in FIG. 2 labelled "output." The circuit of FIG. 1 is then constructed such that ΔA and ΔB provide a delay equal to a multiple of the half pulse period $(t_0/2)$, where the multiple for both ΔA and ΔB delay devices is an odd integral number.

Since one pulse, N, is desired for every three possible pulses from source 10, and a pulse period of $(t_0/2)$ is to be employed, then $(0<k=\frac{1}{2})$ and $(0<k<l)$ where $M>N$ allowing use of either one of the two general relationships given above. The delay periods ΔA and ΔB are then obtained by use of either the first relationship, where $k=\frac{1}{2}$, which is given by:

$$(\Delta A+\Delta B)/t_0=(M+N)$$

where $$(\Delta A-t_0/2)/t_0=M$$

and $$(\Delta B+t_0/2)/t_0=N$$

or the second relationship:

$$(\Delta A+\Delta B+t_0/2)/t_0=(N+M)$$

where $$\Delta B/t_0=N$$

and $$(\Delta A+t_0/2)t_0=M$$

Employing the first relationship to construct the circuit of FIG. 1 and provide an output pulse pattern as shown in the FIG. 2, it may be seen that $$(\Delta A+\Delta B)=3t_0$$

and $$\Delta A=2t_0+t_0/2$$

and $$\Delta B=t_0/2$$

Thus, the ΔA delay device is constructed to have a delay period of $(2t_0+t_0/2)$ while the ΔB delay device is constructed to have a delay period of $(t_0/2)$. Operation of the circuit of FIG. 1 with the delay devices ΔA and ΔB constructed as set forth above commences as is shown in the FIG. 2. At time $t_1$–$t_2$ a first pulse from the source 10 is initially passed through the AND circuit 12 to the output 28 which immediately sets flip-flop 20 to provide a low voltage output on reset output line 26 to the ΔB delay device. The low voltage output condition on line 26 is delayed by the ΔB delay device $(t_0/2)$. Assuming the action of flip-flop 20 is instantaneous, the low voltage output condition is passed to the conditioning input line 14 at a time $t_2$ thus inhibiting the passage of any further pulses from source 10 through AND circuit 12. The first pulse from the clock source 10 is delayed by the ΔA delay device until a time $t_6$ at which time the reset input 24 of flip-flop 20 is energized to reset the flip-flop 20 and provide a high voltage output on line 26. The output of flip-flop 20 on line 26 is applied to the ΔB delay device, for a period $(t_0/2)$, and thence applied to the conditioning input 14 of AND circuit 12 at a time $t_7$ allowing the next pulse at $t_7$–$t_8$ from source 10 to pass through the gate 12 to the output 28.

Employing the alternate relationship as described above, the ΔB delay device is constructed so that $$\Delta B=t_0$$

and $$\Delta A=t_0+t_0/2$$

With the delay devices ΔA and ΔB constructed to provide the delays set forth above, again the first pulse, $t_1$–$t_2$ from source 10 is passed through the AND circuit 12 to the output 16 and thence to the output 28 of the circuit of FIG. 1, which sets flip-flop 20 turning off the high level voltage signal to the ΔB delay device. The conditioning input 14 is then in the low level voltage condition at $t_3$, inhibiting the passage of any further pulses from source 10 through AND circuit 12. The $t_1$–$t_2$ pulse from source 10 is also applied to the ΔA delay device and is applied to the reset input 24 of flip-flop 20 at a time $t_4$ providing a high voltage output signal on line 26 of flip-flop 20 at this time. The high voltage signal on line 26 is then applied to the ΔB delay device and allowed to pass to the conditioning input line 14 of AND circuit 12 at a time $t_6$. Since there is no pulse from source 10 at time $t_6$, the circuit remains with a high voltage signal on line 14 of AND circuit 12 allowing the next pulse, $t_7$–$t_8$ from source 10 to pass to the output 28 of the circuit of FIG. 1.

Figure 3:
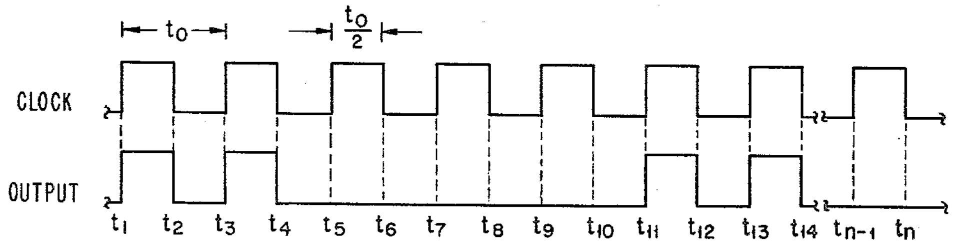
FIG. 3 is a representation of pulses applied to, and the pulses provided by the circuit of FIG. 1 according to another embodiment of this invention.

A more complicated pulse pattern of the type shown in the FIG. 3 is simply achieved by utilizing the above relationships for construction of the delay devices ΔA and ΔB. For instance, it may be seen that for every five pulses from the source 10, two pulses at the output 28 are to be delivered, thus two pulses are to be gated on, while three pulses are to be gated off. According to the first relationship, $$\Delta A=3t_0+t_0/2$$

and $$\Delta B=t_0+t_0/2$$

With the devices ΔA and ΔB constructed to provide the delay as set forth above, the circuit of FIG. 1 operates as follows: assuming the flip-flop 20 is initially in the reset condition, at $t_1$ a first pulse is applied from source 10 and passed through AND gate 12 to output 28, delay device ΔA and the set input 22 of flip-flop 20. At the time $t_1$ the flip-flop 20 is switched to the set state turning off the high voltage output to line 26. Since the output on line 26 is delayed by the ΔB delay device $(t_0+t_0/2)$, the conditioning input line 14 of AND circuit 12 is still energized at the time t3 when the next pulse from source 10 is applied to the AND circuit 12. The second pulse, $t_3$–$t_4$ is passed through the AND circuit to the output 16. At time $t_4$ the conditioning input line 14 of AND circuit 12 is at a low voltage level inhibiting any further pulses from source 10 to pass to the output 16 of the AND circuit. The first pulse from source 10 at $t_1$ is also applied to the ΔA delay device and this pulse is delayed for a period $(3t_0+t_0/2)$ and applied to the reset input of flip-flop 20 at time $t_8$. The flip-flop 20 is then switched to the reset stable state to provide a high voltage output on line 26 to the ΔB delay device. The high voltage output on line 26 is thereafter applied to the conditioning input line 14 after passing through the ΔB delay device $(t_0+t_0/2)$ time increments later. The conditioning input line 14 is then at a high voltage level at $t_{11}$ allowing the pulse $t_{11}$–$t_{12}$ from source 10 to pass through AND circuit 12. The next pulse passed through the AND circuit 12 at $t_3$ is applied to the reset input 24 of flip-flop 20 after passing through the ΔA delay device. This pulse appears at a time $t_{10}$, however, since the flip-flop 20 is already in the reset stable state, no change occurs in its operation. Thus, the pulse from source 10 at a time $t_{11}$ is allowed to pass to the output 28 as is the next pulse $t_{13}$–$t_{14}$.

The circuit of FIG. 1 can be constructed such that the ΔA and ΔB delay devices provide a delay as in accordance with the second method set forth above, in that:

$$\Delta A = 2t_0 + t_0/2$$

and $$\Delta B = 2.0t_0$$

With the ΔA and ΔB delay devices constructed to provide a delay period as set forth above, the first pulse $t_1$–$t_2$ in FIG. 3, appearing at time $t_1$ is passed through the AND circuit 12 since the flip-flop 20 is assumed to be in the normal reset condition. The pulse $t_1$–$t_2$ is then passed through the AND circuit 12 to the output 28; ΔA delay device; and set input 22 of flip-flop 20. The flip-flop 20 is then switched to the set stable state turning off the high voltage output on line 26. The next input pulse $t_3$–$t_4$ from source 10 appears at the AND circuit 12 at time $t_3$ delayed from the initial input pulse for a period ($t_0$). Since the delay device ΔB is constructed to provide a delay of $2.0t_0$, the conditioning input 14 of AND circuit 12 is still up and the next pulse from source 10 at time $t_3$ also passes to the output 28 of the circuit delay device ΔA and the set input 22 of flip-flop 20. The initial pulse $t_1$–$t_2$ from source 10 at time $t_1$ is applied to the reset input 24 of flip-flop 20 delayed by a time ($2t_0+t_0/2$) due to the delay provided by ΔA delay device. The flip-flop 20 is then switched to the reset stable state at $t_6$ providing a high voltage output on line 26 to the ΔB delay device. The output on line 26 is then passed through to the conditioning input 14 of AND circuit 12 delayed by a time ($2.0t_0$) provided by the ΔB delay device. Thus, the flip-flop 20 is switched to the reset stable state at a time $t_6$ and a voltage level is applied to the conditioning input 14 at $t_{10}$. The conditioning input 14 of AND circuit 12 remains at a high voltage level when a pulse $t_{11}$–$t_{12}$ from source 10 is applied thereto. The pulse $t_{11}$–$t_{12}$ is then passed through the AND circuit 12 to the output 28 of the circuit. The pulse $t_3$–$t_4$ passed to the output 28 is applied to the reset input 24 of flip-flop 20 at a time $t_8$. Since the flip-flop 20 is already in the reset stable state, this pulse has no effect. The pulse $t_{11}$–$t_{12}$ passed through the AND circuit 12 is applied to the ΔA delay device and the set input 22 of flip-flop 20, switching the flip-flop 20 to the set stable state. The next pulse $t_{13}$–$t_{14}$ from source 10 is passed through the AND circuit 12 since ΔB delay device provides a delay of ($2.0t_0$) insuring that the conditioning input line 14 of AND circuit 12 is still up allowing the passage of this pulse from source 10.

It should be noted that in the circuit explanation, the small delay which is introduced by the logical circuitry has not been considered and when constructing the circuit, this delay is compensated by a slight adjustment of ΔA and ΔB. Further, long patterns of practically any desired complexity may be generated by chaining a number of individual pattern generators of the type described in FIG. 1. If each generator in the chain feeds only generators with shorter cycles ($N+M$), the synthesis task is made simple although this by no means assures a minimum component count.

In both embodiments of this invention described above, the minimum multiple of pulse periods $k(t_0)$ is seen to be an odd numbered integer, however this is only true where $k$ is a fraction whose denominator is an even number and the value of the fraction is $k \leq 1/2$. If, on the other hand, $k$ is a fraction whose denominator is an odd number and the value of the fraction is $k \leq 1/2$, then the minimum multiple of pulse periods $k(t_0)$ provided by each of the ΔA and ΔB delay devices is an even numbered integer. In the case where $k > 1/2$ the multiple of pulse periods $k(t_0)$ provided by each delay device ΔA and ΔB then takes on a fractional order.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A circuit for providing a desired number of N pulses within a cycle period of ($N+M$) possible pulses from a pulse generator adapted to provide a series of pulses displaced by a time increment ($t_0$) having a pulse period duration of $k(t_0)$, where ($0<k<1$); means comprising an AND circuit having a primary input, a conditioning input and an output and a conditioning circuit connected in feedback loop arrangement from the output of said AND circuit to the conditioning input of said AND circuit for gating the pulses from said generator to provide a predetermined number of N pulses in each cycle of ($N+M$) possible pulses from said generator to the output of said AND circuit; said conditioning circuit comprising; a bistable switching circuit having a set input, a reset input, and a reset output; a ΔA delay device having an input and output, its output being connected to the reset input of said switching device for delaying an input thereto a first predetermined multiple of $k(t_0)$ pulse periods; a ΔB delay device having an input and output, its output being connected to the reset output of said switching device for delaying an output from said switching device a second predetermined multiple of $k(t_0)$ pulse periods, said first and second predetermined multiple of $k(t_0)$ pulse periods being determined by and dependent upon the value of $k$; means connecting the output of said AND circuit to the set input of said switching device and the input of the ΔA delay device and means connecting the output of the ΔB delay device to the conditioning input of said AND circuit.

2. The circuit as set forth in claim 1 wherein the cycle ($N+M$) of possible pulses from said generator provided to the output of said AND circuit is related to both said ΔA and ΔB delay devices by a relationship $$(N+M-1+2k)t_0 \leq \Delta A + \Delta B \leq (N+M)t_0$$

where $$(N-1+k)t_0 \leq \Delta B \leq Nt_0$$

3. The circuit as set forth in claim 1, where the cycle ($N+M$) of possible pulses from said generator provided at the output of said AND circuit is related to both said ΔA and ΔB delay devices by a relationship $$(N+M-1+k)t_0 \leq \Delta A + \Delta B \leq (N+M)t_0$$

where $$(N-1+k)t_0 \leq \Delta B \leq Nt_0$$

4. The circuit as set forth in claim 3, wherein said first and second predetermined multiples of $k(t_0)$ pulse periods are each odd numbered integers.

5. The circuit as set forth in claim 3, wherein said first and second predetermined multiples of $k(t_0)$ pulse periods are each even numbered integers.

6. A pattern generating circuit for producing a recurrent pulse pattern having a predetermined number of pulses and blank positions which comprises:

a clock pulse generator;

an AND circuit having a primary input connected to the output of said generator, a conditioning input and an output;

the combination of a bistable flip-flop circuit having first and second conditioning inputs and a second condition output, the output of the AND circuit being connected directly to the first conditioning input of said flip-flop and a first delay circuit connected between the output of said AND circuit and the second conditioning input of said flip-flop and the generating circuit output terminal connected directly to the output of said AND circuit;

a second delay circuit connected between the second condition output of said flip-flop and the conditioning input of said AND circuit;

wherein said pattern generating circuit is initially set to the second condition of said flip-flop upon the beginning of a pattern generating sequence.

References Cited by the Examiner

UNITED STATES PATENTS 2,892,998 6/59 Eckert et al.

ARTHUR GAUSS, *Primary Examiner.*

JOHN W. HUCKERT, *Examiner.*